(12) United States Patent
Zapilko et al.

(10) Patent No.: US 7,938,911 B2
(45) Date of Patent: May 10, 2011

(54) PROCESS FOR CLEANING A SEMICONDUCTOR WAFER USING A CLEANING SOLUTION

(75) Inventors: Clemens Zapilko, Burghausen (DE); Thomas Buschhardt, Burghausen (DE); Diego Feijoo, Burghausen (DE); Guenter Schwab, Neuoetting (DE)

(73) Assignee: Siltronic AG, Munich (DE)

( * ) Notice: Subject to any disclaimer, the term of this patent is extended or adjusted under 35 U.S.C. 154(b) by 326 days.

(21) Appl. No.: 12/140,306

(22) Filed: Jun. 17, 2008

(65) Prior Publication Data

US 2009/0007940 A1 Jan. 8, 2009

(30) Foreign Application Priority Data

Jul. 4, 2007 (DE) .................. 10 2007 030 957

(51) Int. Cl.
*B08B 3/00* (2006.01)
(52) U.S. Cl. ............... 134/28; 134/26; 134/27; 134/29; 134/2; 134/3
(58) Field of Classification Search .............. 134/27, 134/29, 26, 28, 61, 79, 80; 510/165, 383, 510/400, 405, 435; 252/79.1, 88.2, 193
See application file for complete search history.

(56) References Cited

U.S. PATENT DOCUMENTS

| | | | | |
|---|---|---|---|---|
| 3,607,480 A * | 9/1971 | Harrap et al. | ................ | 438/756 |
| 3,923,567 A * | 12/1975 | Lawrence | ................ | 438/4 |
| 4,171,242 A * | 10/1979 | Liu | ................ | 438/753 |
| 4,261,791 A * | 4/1981 | Shwartzman | ................ | 438/694 |
| RE31,198 E * | 4/1983 | Binns | ................ | 134/3 |
| 4,545,918 A * | 10/1985 | Pralus | ................ | 252/79.3 |
| 4,556,432 A * | 12/1985 | Erckel et al. | ................ | 127/37 |
| 4,589,924 A * | 5/1986 | Erckel et al. | ................ | 127/37 |
| 4,778,532 A * | 10/1988 | McConnell et al. | ................ | 134/10 |
| 4,795,582 A * | 1/1989 | Ohmi et al. | ................ | 252/79.3 |
| 4,891,325 A * | 1/1990 | Hezel et al. | ................ | 438/4 |
| 4,899,767 A * | 2/1990 | McConnell et al. | ................ | 134/56 R |
| 4,917,123 A * | 4/1990 | McConnell et al. | ................ | 134/95.2 |
| 5,275,184 A * | 1/1994 | Nishizawa et al. | ................ | 134/57 R |
| 5,520,744 A * | 5/1996 | Fujikawa et al. | ................ | 134/11 |
| 5,656,097 A * | 8/1997 | Olesen et al. | ................ | 134/1 |
| 5,722,441 A * | 3/1998 | Teramoto | ................ | 134/56 R |
| 5,783,495 A * | 7/1998 | Li et al. | ................ | 438/738 |
| 5,810,940 A * | 9/1998 | Fukazawa et al. | ................ | 134/3 |
| 5,893,756 A | 4/1999 | Berman et al. | | |
| 5,931,173 A * | 8/1999 | Schiele | ................ | 134/57 R |
| 5,932,022 A * | 8/1999 | Linn et al. | ................ | 438/795 |
| 5,933,739 A * | 8/1999 | Lin | ................ | 438/301 |
| 5,950,645 A * | 9/1999 | Olesen et al. | ................ | 134/98.1 |
| 5,983,909 A * | 11/1999 | Yeol et al. | ................ | 134/102.1 |
| 6,037,271 A * | 3/2000 | Carlson et al. | ................ | 438/751 |
| 6,044,851 A * | 4/2000 | Grieger et al. | ................ | 134/1.3 |
| 6,158,445 A * | 12/2000 | Olesen et al. | ................ | 134/1.3 |
| 6,158,447 A * | 12/2000 | Kamikawa et al. | ................ | 134/56 R |
| 6,171,865 B1 * | 1/2001 | Weigl et al. | ................ | 436/52 |
| 6,443,812 B1 * | 9/2002 | Costas et al. | ................ | 451/41 |
| 6,482,749 B1 * | 11/2002 | Billington et al. | ................ | 438/745 |
| 6,584,989 B2 * | 7/2003 | Taft et al. | ................ | 134/100.1 |
| 6,641,899 B1 * | 11/2003 | Colburn et al. | ................ | 428/209 |
| 6,767,409 B2 | 7/2004 | Aoki et al. | | |
| 6,848,455 B1 * | 2/2005 | Shrinivasan et al. | ................ | 134/1.3 |
| 6,875,706 B2 * | 4/2005 | Lee et al. | ................ | 438/745 |
| 7,384,870 B2 * | 6/2008 | Saito et al. | ................ | 438/692 |
| 7,784,998 B2 * | 8/2010 | Jang et al. | ................ | 366/150.1 |
| 7,819,984 B2 * | 10/2010 | DeKraker et al. | ................ | 134/30 |
| 2002/0035762 A1 * | 3/2002 | Okuda et al. | ................ | 15/77 |
| 2002/0189640 A1 * | 12/2002 | Linn et al. | ................ | 134/3 |
| 2003/0139059 A1 * | 7/2003 | Andreas | ................ | 438/745 |
| 2004/0031503 A1 | 2/2004 | Eitoku | | |
| 2005/0000545 A1 * | 1/2005 | Inagaki | ................ | 134/18 |
| 2006/0040595 A1 * | 2/2006 | Svirchevski et al. | ................ | 451/56 |
| 2007/0163618 A1 * | 7/2007 | Kim et al. | ................ | 134/1.3 |
| 2008/0233753 A1 * | 9/2008 | Idani | ................ | 438/700 |

FOREIGN PATENT DOCUMENTS

| | | | |
|---|---|---|---|
| EP | 0 805 484 A1 | | 11/1997 |
| JP | 04196424 A | * | 7/1992 |
| JP | 2007019506 A | | 1/2007 |
| JP | 2007134690 A | | 5/2007 |
| JP | 2007149891 A | | 6/2007 |
| KR | 0305093 | | 9/2001 |
| KR | 1020030052817 A | | 6/2003 |
| KR | 1020040007876 A | | 1/2004 |
| WO | 98/56726 A1 | | 12/1998 |
| WO | WO 9856726 A1 | * | 12/1998 |

* cited by examiner

*Primary Examiner* — Michael Kornakov
*Assistant Examiner* — Katelyn B Whatley
(74) *Attorney, Agent, or Firm* — Brooks Kushman P.C.

(57) ABSTRACT

Semiconductor wafers are cleaned using a cleaning solution containing an alkaline ammonium component in an initial composition, wherein the semiconductor wafer is brought into contact with the cleaning solution in an individual-wafer treatment, and in the course of cleaning hydrogen fluoride is added as further component to the cleaning solution, and the cleaning solution has at the end of cleaning, a composition that differs from the initial composition.

11 Claims, No Drawings

PROCESS FOR CLEANING A SEMICONDUCTOR WAFER USING A CLEANING SOLUTION

BACKGROUND OF THE INVENTION

1. Field of the Invention

The invention relates to a process for cleaning a semiconductor wafer using a cleaning solution, more precisely a process in which the semiconductor wafer is cleaned in an individual-wafer treatment mode.

2. Background Art

Individual-wafer cleaning processes have some advantages over multiwafer cleaning processes in which a plurality of wafers are cleaned simultaneously. These advantages include low consumption of chemicals, higher process flexibility and also the possibility of treating the wafer front side and the wafer rear side using different cleaning solutions. A particular advantage of individual-wafer treatment is that the risk of cross-contamination, that is to say the transfer of contaminants between semiconductor wafers, is precluded. The essential disadvantage of these processes in comparison with multiwafer treatment is the low throughput. Since silicon wafers having a very large diameter (300 mm) are increasingly being processed in the semiconductor industry, this disadvantage is receding into the background, however.

Individual-wafer cleaning can be effected according to two fundamentally different processes. Thus, the cleaning solution can be provided as a bath into which the semiconductor wafer is dipped for a certain time. More often, an alternative arrangement is used in which the semiconductor wafer is anchored on a rotating plate and the cleaning solution is injected or sprayed onto one or both lateral surfaces of the semiconductor wafer through nozzles. The spent cleaning solution flows away from the semiconductor wafer under the influence of centrifugal force. One example of such an individual-wafer treatment, which is also suitable for etching a semiconductor wafer, is described in US 2004/0031503 A1, for example.

In particular, semiconductor wafers on which one or a plurality of further layers are intended to be epitaxially deposited must have particularly intensively cleaned surfaces prior to deposition. Contaminants that must be removed are particle contaminants, metal ions bound on the surface, and organic compounds that often cover semiconductor wafers as a thin surface film. Basic solutions of ammonia and hydrogen peroxide in water (ammonium peroxide mixture, APM) are normally used for removing particles and organic compounds. A central prerequisite for the deposition of high-quality epitaxial layers is complete removal of the amorphous oxide layer coating the surface of semiconductor materials such as silicon, germanium and silicon/germanium alloys. The surface oxide is dissolved using aqueous solutions containing hydrogen fluoride, HF. A semiconductor wafer treated using an HF solution has a hydrophobic, oxygen free surface. A cleaning solution which is particularly suitable for this purpose on account of its high etching rate for silicon dioxide contains a mixture of ammonium fluoride, $NH_4F$, or a tetraalkylammonium fluoride, e.g. tetramethylammonium fluoride $N(CH_3)_4F$, and hydrogen fluoride. WO 98/56726 A1 shows that it is advantageous for the cleaning solution not to be prepared until directly prior to use, from ammonium hydroxide or tetraalkylammonium hydroxide and hydrogen fluoride.

SUMMARY OF THE INVENTION

It is an object of the present invention to present a cleaning process which has an improved cleaning effect over and above the advantages of the individual-wafer treatment and the preparation of the cleaning solution at the site of its use. These and other objects are achieved through use of a cleaning process employing an alkaline ammonium cleaning solution to which hydrogen fluoride is added during the course of cleaning.

DETAILED DESCRIPTION OF THE PREFERRED EMBODIMENT(S)

The invention thus relates to a process for cleaning a semiconductor wafer using a cleaning solution containing an alkaline ammonium component in an initial composition, wherein the semiconductor wafer is brought into contact with the cleaning solution in an individual-wafer treating process, and during the course of cleaning, hydrogen fluoride is added as further component to the cleaning solution, and the cleaning solution has, at the end of cleaning, a composition that differs from the initial composition.

The process is distinguished by the fact that the composition of the cleaning solution is changed during the course of cleaning, in order to control the cleaning mechanism in a targeted manner. At the start of cleaning, the cleaning solution contains the alkaline ammonium component but no free HF. During the course of cleaning, hydrogen fluoride is added as further component to the cleaning solution. What is thereby achieved is that firstly conditions are created which are optimal for dissolving particles from the semiconductor wafer and permanently transferring them into the cleaning solution, and later, conditions are established which are optimal for permanently removing metals from the semiconductor wafer and completely stripping away the oxide film on the surface. The overall result is an improved cleaning effect compared with the use of a fixed, preset composition of the cleaning solution, even if the cleaning solution, as in the process according to the invention, is also not prepared until just before use.

The change in the concentration of the cleaning solution is controlled such that the ratio of the molar concentrations of hydrogen fluoride and alkaline ammonium component, $HF:NR_4OH$, is less than 1 at the start of cleaning and is greater than 1 at the end of cleaning. R preferably represents the radicals H or a $C_{1-4}$ alkyl group, where tetramethylammonium hydroxide ($N(CH_3)_4OH$, "TMAH") is preferred over ammonium hydroxide ($NH_4OH$) and longer-chain tetraalkylammonium hydroxides. The concentration of the alkaline ammonium component in the cleaning solution is preferably 0.001 to 25% by weight at the start of cleaning, and preferably 0.001 to 10% by weight at the end of cleaning. The concentration of HF in the cleaning solution is preferably 0.01 to 25% by weight at the end of cleaning. The molar quantitative ratio $HF:NR_4OH$ is preferably between 1.1 and 100 at the end of cleaning. As the proportion of hydrogen fluoride in the cleaning solution increases, the pH of the cleaning solution decreases and changes from a pH in a strongly basic range to an acidic pH in the range from pH 1 to 5. The cleaning of particles is predominant in the basic range and the cleaning of metals is predominant in the acidic range. As a result of the excess of hydrogen fluoride over the alkaline ammonium component at the end of the cleaning process a solution arises which dissolves the surface oxide on the semiconductor wafer. Ammonium ions adsorb particles stripped away from the semiconductor wafer and thus prevent recontamination of the semiconductor wafer in the further course of cleaning.

In the preferred configuration of the process, the semiconductor wafer is firstly brought into contact with a cleaning solution containing TMAH but no HF. This takes place in a device suitable for an individual-wafer treatment, for example in a bath with overflow or in a centrifuge. It is not until in the further course of cleaning that hydrogen fluoride is added to the cleaning solution, in which case HF is added in one or a plurality of steps or continuously. In the case of cleaning in a bath, an aqueous solution containing TMAH is initially provided and the semiconductor wafer is dipped therein. Later a cleaning solution having a changed composition is prepared in the bath by further TMAH solution and an aqueous HF solution being introduced simultaneously into the bath in the presence of the semiconductor wafer. The concentrations and inflow rates of TMAH and HF are set independently of one another and changed, if appropriate, during the further course of cleaning. Thus, the concentration of HF in the cleaning solution can be increased further, for example, solely by way of the inflow rates, by increasing the inflow rate of HF solution in comparison with the inflow rate of TMAH solution or conversely by decreasing the inflow rate of TMAH solution in comparison with the inflow rate of HF. The corresponding case occurs during cleaning of the semiconductor wafer on the plate of a centrifuge. Firstly, an aqueous solution which contains TMAH and is supplied via one or a plurality of nozzles is squirted or sprayed onto one or both lateral surfaces of the semiconductor wafer rotating on the plate. Later, a cleaning solution having a changed composition is prepared on the semiconductor wafer by aqueous HF solution additionally being supplied to the semiconductor wafer through one or a plurality of further nozzles. In this preferred embodiment of the invention, too, the concentrations and inflow rates of TMAH solution and HF solution are set independently of one another and changed, if appropriate, during the course of further cleaning.

The preferred duration of the cleaning phase with a cleaning solution which as yet contains no free HF is 1 to 300 s, more preferably 5 to 30 s. The concentration of TMAH in the cleaning solution is preferably 0.001 to 25% by weight in water. In order to further improve the performance with respect to removing particles, the cleaning solution can contain surfactants or short-chain alcohols in this phase, in particular. Suitable surfactants are, in particular, anionic or non-ionic detergents, e.g. fatty alcohol ethoxylates or long-chain alkylsulfonates. Suitable alcohols are e.g. butanol, ethylene glycol or glycerol. The cleaning solution should not contain ozone, hydrogen peroxide or any other oxidizing agent.

The concentration of aqueous HF supplied later is preferably 0.01 to 50% by weight in water. The preferred duration of the phase of cleaning the semiconductor wafer using a cleaning solution which contains HF is 1 to 300 s, more preferably 5 to 30 s.

The temperature of the cleaning solution is 15 to 95° C., preferably 15 to 45° C., in both phases.

At the end of the process according to the invention, the surface of the semiconductor wafer is hydrophobic and free of surface oxide. For further treatment, the semiconductor wafer can be rinsed with another cleaning solution, for example with deionized water, and subsequently dried. However, it is also possible to return to the starting point of the process and to repeat the process once or more often, by the semiconductor wafer being cleaned again using the cleaning solution in the initial composition.

Semiconductor wafers for which the cleaning process presented is particularly suitable are, in particular, semiconductor wafers having a surface composed of silicon or an alloy of silicon and germanium which is to be cleaned in order to be later coated.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A process for cleaning a semiconductor wafer in an individual-wafer treatment using a cleaning solution, comprising:
   contacting the semiconductor wafer with a first cleaning solution comprising an alkaline ammonium component, the first solution being free of HF, ozone, and hydrogen peroxide;
   adding at least HF to the first cleaning solution incrementally or continuously to form a further cleaning solution, such that the HF concentration in the further cleaning solution is increased with respect to the HF concentration present upon an initial introduction of HF to the first cleaning solution, the cleaning solution remaining free of ozone and hydrogen peroxide
   wherein a molar concentration ratio of hydrogen fluoride to alkaline ammonium component, $HF:NR_4OH$, of <1 initially present in the further cleaning solution is increased to >1 at the end of cleaning, wherein R independently represents H, methyl, ethyl, propyl or butyl radicals.

2. The process of claim 1, wherein hydrogen fluoride is added to the cleaning solution and the concentration of the alkaline ammonium component is reduced thereby.

3. The process of claim 1, wherein hydrogen fluoride and additional alkaline ammonium component are both added to the cleaning solution, at rates at which the molar ratio of HF to alkaline ammonium component increases.

4. The process of claim 1, wherein the cleaning solution comprises surfactants or short chain alcohols as further components.

5. The process of claim 2, wherein the cleaning solution comprises surfactants or short chain alcohols as further components.

6. The process of claim 1, wherein the cleaning solution is injected or sprayed onto a rotating semiconductor wafer through nozzles.

7. The process of claim 1, wherein the cleaning solution is introduced into a bath into which the semiconductor wafer is dipped.

8. The process of claim 1, wherein the cleaning is repeated at least once by the semiconductor wafer being cleaned again using a cleaning solution of an initial alkaline ammonium composition.

9. The process of claim 1, wherein the concentration of $NR_4OH$ in the first cleaning solution is from 0.001 to 25% by weight in water.

10. The process of claim 1, wherein the amount of HF supplied to the first cleaning solution is sufficient to provide a concentration of HF of 0.01 to 50% by weight in water.

11. The process of claim 1, wherein due to the addition of HF to the first cleaning solution, the pH changes from a pH in a strongly basic range in the first cleaning solution to a pH in the range of 1 to 5.

* * * * *